(12) United States Patent
Bogner et al.

(10) Patent No.: US 8,097,937 B2
(45) Date of Patent: Jan. 17, 2012

(54) LEADFRAME AND HOUSING FOR RADIATION-EMITTING COMPONENT, RADIATION-EMITTING COMPONENT, AND A METHOD FOR PRODUCING THE COMPONENT

(75) Inventors: Georg Bogner, Lappersdorf (DE);
Herbert Brunner, Regensburg (DE);
Michael Hiegler, Regensburg (DE);
Günter Waitl, Regensburg (DE)

(73) Assignee: OSRAM AG, Munich (DE)

( * ) Notice: Subject to any disclaimer, the term of this patent is extended or adjusted under 35 U.S.C. 154(b) by 0 days.

(21) Appl. No.: 10/683,712

(22) Filed: Oct. 10, 2003

(65) Prior Publication Data
US 2004/0075100 A1    Apr. 22, 2004

Related U.S. Application Data

(63) Continuation of application No. PCT/DE02/01306, filed on Apr. 9, 2002.

(30) Foreign Application Priority Data

Apr. 10, 2001   (DE) .................. 101 17 889

(51) Int. Cl.
*H01L 29/22* (2006.01)
*H01L 23/495* (2006.01)

(52) U.S. Cl. .......... 257/676; 257/684; 257/706; 257/98; 257/99; 257/100

(58) Field of Classification Search .............. 257/676, 257/98–100, 81, 625, 706, 79, 789, 795, 257/666, 684, E23.051, 431, 66
See application file for complete search history.

(56) References Cited

U.S. PATENT DOCUMENTS

| | | | |
|---|---|---|---|
| 3,780,357 A | 12/1973 | Haitz | |
| 5,218,215 A | 6/1993 | Liang et al. | |
| 5,345,106 A | 9/1994 | Doering et al. | |
| 5,542,175 A * | 8/1996 | Bhatt et al. | ........... 29/846 |
| 5,608,267 A * | 3/1997 | Mahulikar et al. | ........... 257/796 |
| 5,650,663 A * | 7/1997 | Parthasarathi | ........... 257/706 |
| 5,812,570 A | 9/1998 | Spaeth | |
| 5,835,988 A | 11/1998 | Ishii | |

(Continued)

FOREIGN PATENT DOCUMENTS

CN    1160934    12/1996

(Continued)

OTHER PUBLICATIONS

English translation of relevant parts of previously submitted German Published Non-Prosecuted Patent Application DT 2 315 709 (Schöberl), dated Oct. 10, 1974.

(Continued)

*Primary Examiner* — Kenneth A Parker
*Assistant Examiner* — Joseph Nguyen
(74) *Attorney, Agent, or Firm* — Fish & Richardson P.C.

(57) ABSTRACT

A leadframe, a housing, a radiation-emitting component formed therefrom, and a method for producing the component includes the leadframe having a mount part with at least one bonding wire connecting area and at least one electrical solder connecting strip into which a separately manufactured thermal connecting part, which has a chip mounting area, is linked. To form a housing, the leadframe is sheathed, preferably, with a molding compound, with the thermal connecting part being embedded such that it can be thermally connected from the outside.

33 Claims, 3 Drawing Sheets

U.S. PATENT DOCUMENTS

| | | | |
|---|---|---|---|
| 6,129,993 A * | 10/2000 | Kumamoto et al. | 428/614 |
| 6,208,023 B1 | 3/2001 | Nakayama et al. | |
| 6,211,462 B1 * | 4/2001 | Carter et al. | 174/52.4 |
| 6,246,111 B1 * | 6/2001 | Huang et al. | 257/675 |
| 6,271,924 B1 | 8/2001 | Ngoi et al. | |
| 6,274,924 B1 * | 8/2001 | Carey et al. | 257/676 |
| 6,376,902 B1 * | 4/2002 | Arndt | 257/678 |
| 6,459,130 B1 | 10/2002 | Arndt et al. | |
| 6,482,674 B1 * | 11/2002 | Kinsman | 438/106 |
| 6,516,516 B1 * | 2/2003 | Lee | 29/855 |
| 6,517,218 B2 | 2/2003 | Hochstein | 362/294 |
| 6,614,103 B1 * | 9/2003 | Durocher et al. | 257/678 |
| 6,624,491 B2 * | 9/2003 | Waitl et al. | 257/434 |
| 6,645,783 B1 * | 11/2003 | Brunner et al. | 438/26 |
| 6,664,649 B2 * | 12/2003 | Huang | 257/796 |
| 6,903,380 B2 * | 6/2005 | Barnett et al. | 257/98 |
| 2001/0030866 A1 * | 10/2001 | Hochstein | 362/294 |
| 2001/0054761 A1 * | 12/2001 | Han et al. | 257/723 |
| 2003/0137032 A1 * | 7/2003 | Abbott | 257/666 |
| 2004/0178462 A1 * | 9/2004 | Sakaguchi et al. | 257/432 |

FOREIGN PATENT DOCUMENTS

| | | |
|---|---|---|
| CN | 1207585 | 2/1999 |
| DE | 2 405 829 | 8/1974 |
| DE | 2 315 709 | 10/1974 |
| DE | 40 17 697 A1 | 12/1991 |
| DE | 195 36 454 A1 | 4/1997 |
| DE | 195 36 463 A1 | 4/1997 |
| DE | 196 25 384 A1 | 1/1998 |
| DE | 199 00 335 A1 | 12/1999 |
| DE | 199 45 675 A1 | 5/2000 |
| EP | 1 139 439 A1 | 10/2001 |
| JP | 58218153 * | 12/1983 |
| JP | 58218153 A * | 12/1983 |
| JP | 61-35576 | 2/1986 |
| JP | 1-129424 | 5/1989 |
| JP | 2-56956 | 2/1990 |
| JP | 02187058 A * | 7/1990 |
| JP | 402187058 * | 7/1990 |
| JP | 5-102531 * | 10/1991 |
| JP | 5102531 A * | 10/1991 |
| JP | 4-230056 | 8/1992 |
| JP | 07202271 | 8/1995 |
| JP | 7-283441 | 10/1995 |
| JP | 7-307492 | 11/1995 |
| JP | 10303464 | 11/1998 |
| JP | 11-346006 | 12/1999 |
| JP | 11346006 | 12/1999 |
| JP | 2000 294 832 | 10/2000 |
| JP | 2001-185763 | 7/2001 |
| WO | WO 98/20718 | 5/1998 |
| WO | 00/55914 | 9/2000 |

OTHER PUBLICATIONS

LumiLeds Lighting: "HPWL-Mx1A, LuxeonTM Power Light Source", LumiLeds Lighting Publication No. DS15 (Jan. 2001), pp. 1-7.

The English Translation of the Examination Report for Japanese Patent Application No. 2002-581592 dated Mar. 11, 2009.

Japanese Examination Report with regard to Japanese Patent Application No. 2002-581592 dated Jan. 29, 2010.

* cited by examiner

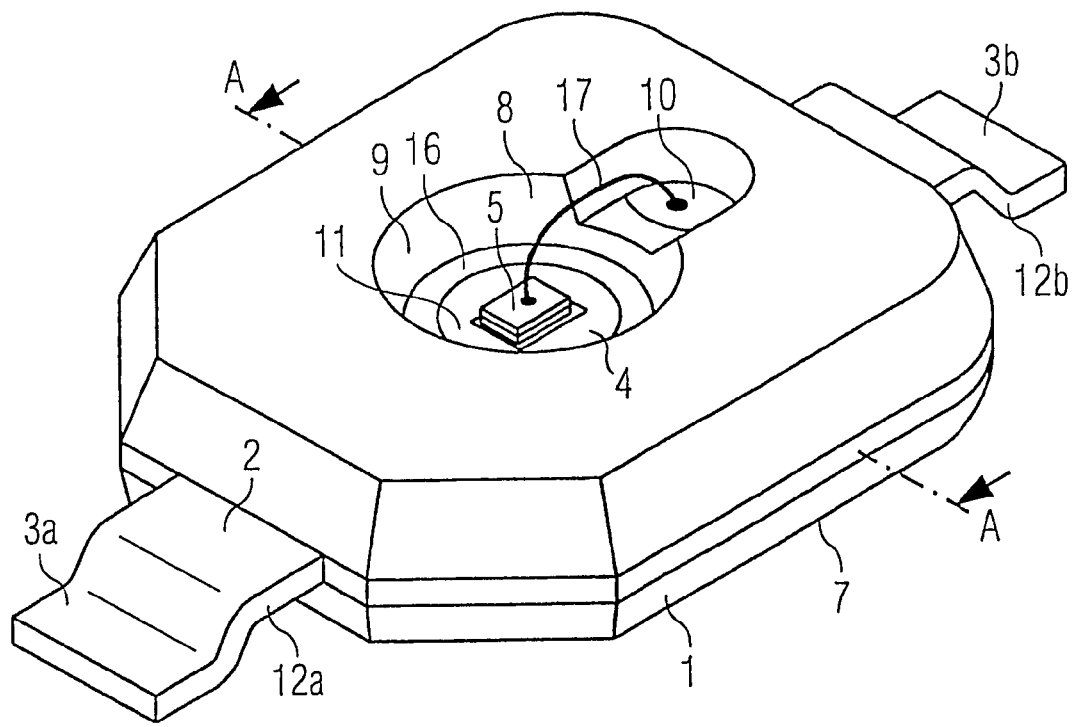
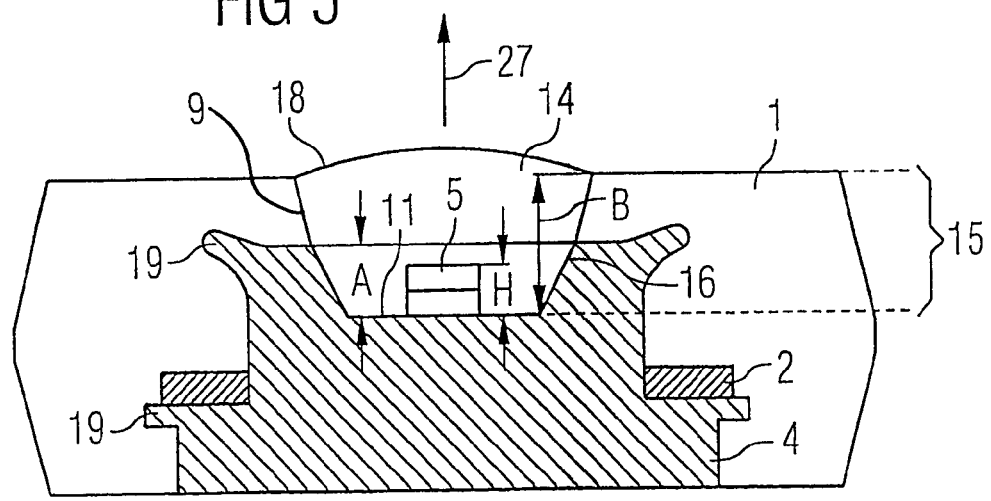

LEADFRAME AND HOUSING FOR RADIATION-EMITTING COMPONENT, RADIATION-EMITTING COMPONENT, AND A METHOD FOR PRODUCING THE COMPONENT

CROSS-REFERENCE TO RELATED APPLICATION

This application is a continuation of copending International Application No. PCT/DE02/01306, filed Apr. 9, 2002, which designated the United States and was not published in English.

BACKGROUND OF THE INVENTION

FIELD OF THE INVENTION

The invention relates to a leadframe for a radiation-emitting component, preferably, a light-emitting diode component, to A housing for light-emitting components, preferably, light-emitting diodes, to a radiation-emitting component having a radiation-emitting chip, and to a method for producing the component.

Leadframes for radiation-emitting semiconductor components are known, for example, from German Published, Non-Prosecuted Patent Application DE 195 36 454. The semiconductor components that are described therein have a housing base body with a leadframe embedded therein, as well as a radiation-emitting semiconductor body that is mounted on the leadframe. The leadframe and the housing base body, at the same time, act as reflectors for the radiation that is produced.

Furthermore, area elements of the leadframe that project out of the housing base body are in the form of external electrical connecting strips, and the housing is shaped such that the component is suitable for surface mounting. To achieve good dissipation of the heat losses that are produced, particularly in the case of high-power semiconductor components, a portion of the reflector can be passed out of the housing base body, as a thermal connection.

In the case of components with high optical power levels and correspondingly high power losses, an even more efficient way of heat dissipation is desirable or necessary.

SUMMARY OF THE INVENTION

It is accordingly an object of the invention to provide a leadframe and housing for a radiation-emitting component, a radiation-emitting component, and a method for producing the component that overcome the hereinafore-mentioned disadvantages of the heretofore-known devices and methods of this general type and that provides improved heat dissipation that, in particular, allows high optical power levels to be produced in the component, for radiation-emitting components, and specifies a production method for such a purpose.

With the foregoing and other objects in view, there is provided, in accordance with the invention, a leadframe for a radiation-emitting component, preferably, a light-emitting diode, having at least one chip mounting area, at least one wire connecting area and at least one external electrical connecting strip collectively configured, for example, for mounting and electrical connection of the component on a printed circuit board, with a mount part being provided that has the wire connecting area and the electrical connecting strip, and into which a thermal connecting part that is manufactured separately from the rest of the leadframe is linked, on which the chip mounting area is disposed. In the case of a component having such a leadframe, the heat losses that are produced during operation are dissipated primarily through the thermal connecting part. The thermal connecting part is, preferably, electrically conductively connected to the mount part, and is, at the same time, used as an electrical connection for the chip.

The thermal connecting part, which is manufactured separately from the rest of the leadframe, in this case has the advantage that it can be considerably better optimized for absorption and dissipation of greater heat loss levels than an integral leadframe. Thus, in the case of such a thermal connecting part, the thickness, the thermal conductivity, the thermal coefficient of expansion, and the thermal connecting surface can be very largely optimized independently of the requirements for the rest of the leadframe. In particular, in the case of the thermal connecting part, a high thermal capacity can, advantageously, be achieved so that the thermal connecting part forms an efficient heat sink. A large thermal connecting surface reduces the thermal contact resistance and, thus, improves the heat conduction and the heat emission to the environment.

In accordance with another feature of the invention, the mount part has an insertion opening, for example, in the form of a bracket or eye, into which the thermal connecting part is linked. This should be understood as meaning that the thermal connecting part is inserted into the insertion opening in the leadframe, and is connected on its circumference to the leadframe.

In accordance with a further feature of the invention, the thermal connecting part and the mount part are connected by at least one of the group consisting of a crimped connection, a riveted connection, a soldered connection, and a welded connection therebetween.

For such a purpose, the thermal connecting part can, for example, be connected by brackets to the mount part, and/or can be crimped or riveted to the mount part. For the purposes of the invention, a crimped connection is, preferably, formed between the thermal connecting part and the mount part, which is distinguished by high mechanical strength and good electrical conductivity. A crimped connection may, for example, be formed by the mount part and the thermal connecting part being positioned with respect to one another, for example, by insertion of the connecting part into an insertion opening in the mount part, and the thermal connecting part, then, being deformed such that a mechanically firm seat is produced for the connecting part in the mount part. A tool in the form of a hammer or die may be used for the deformation process.

The connecting part is, preferably, shaped such that it can be connected to the mount part in the form of a rivet. Deformation of individual webs or struts of the connecting part may possibly also be sufficient to form a crimped connection of adequate strength between the connecting part and the mount part.

For the purposes of the invention, other types of connections between the connecting part and the mount part may be provided in addition or as alternatives. By way of example, a soldered connection or welded connection is suitable for such a purpose. Furthermore, the connecting part may be adhesively bonded to the mount part.

This, advantageously, results in a mechanically robust framework for the semiconductor component, which can be produced with comparatively little technical complexity.

In accordance with an added feature of the invention, preferably, the thermal connecting part has a reflector well surrounding the chip mounting area. In the component that is so formed, the thermal connecting part improves the radiation yield and the beam focusing of the component. In this development of the invention, a metallic thermal connecting part is, preferably, used because the metal surfaces are very highly suitable for use as reflector surfaces due to their low absorption losses and highly directional reflection, possibly in the form of mirror reflection.

In accordance with yet an added feature of the invention, the wire connecting area is disposed at a higher level than the chip mounting area as viewed from the chip mounting area.

In accordance with yet an additional feature of the invention, the reflector well has an edge and the wire connecting area is disposed above the edge as viewed from the chip mounting area. To improve the mechanical robustness, particularly in the case of a housing or component as will be explained in more detail in the following text, it is advantageous to configure the height of the reflector well of the thermal connecting part such that it is not greater than twice the height of the chip that is intended to be disposed on the chip mounting area.

Due to their high thermal conductivity, metals are suitable for use as the material for the thermal connecting part, in particular, copper or aluminum or alloys formed therefrom. Other preferred materials are molybdenum, iron, nickel, and tungsten as well as nickel/iron and copper/tungsten alloys, whose thermal coefficient of expansion is well matched to the thermal coefficients of expansion of semiconductor materials such as gallium arsenide, gallium nitride, and systems based thereon. Further suitable materials for the thermal connecting part are ceramics and semiconductors such as silicon. The thermal connecting part may also be formed from two or more layers, for example, as a metal/ceramic composite system.

In accordance with an additional feature of the invention, the chip-mounting surface on the thermal connecting part is, preferably, provided with a coating that improves the surface characteristics for fitting of a chip (bonding characteristics). This coating may, for example, include a silver or gold coating.

In accordance with yet another feature of the invention, it is also advantageous to provide the solder connecting strip and/or the bonding wire connecting area with a surface coating that improves the soldering and bonding characteristics, for example, a gold, silver, tin, or zinc coating.

In accordance with yet a further feature of the invention, the mount part, preferably, contains copper or soft iron and may, for example, be stamped from appropriate sheets. The mount part for the invention is, advantageously, not used for heat dissipation, and can, thus, be optimized for the power supply function and with regard to its bending characteristics and adhesion of a molding compound that will be described in more detail in the following text.

This includes, for example, configuring the thickness of the mount part such that it can be manufactured, easily stamped, and bent into shape from a mount strip of a roll. Processing characteristics such as these advantageously allow automated manufacture and the individual components to be disposed in a sealed manner (with a short pitch) on the mount strip.

The thin mount part that is required for such a purpose generally makes it more difficult to cool the chip adequately. The cross-section of a thermal connection is limited, in particular, for mechanical robustness reasons. This disadvantage is overcome by the linked thermal connecting part in the invention.

With the objects of the invention in view, there is also provided a housing for light-emitting components, including a leadframe including a mount part having at least one wire connecting area and at least one external electrical connecting strip, and a separately manufactured thermal connecting part linked into the mount part, the thermal connecting part having at least one chip mounting area.

To form a housing for a radiation-emitting component, the leadframe is, preferably, enclosed by a housing base body, according to the invention. For such a purpose, the leadframe is, preferably, embedded in a molding compound that forms the housing base body, for example, an injection-molded or injection-compression compound. The configuration allows the housing to be produced at low cost using the injection-molded or injection-compression method. The molding compound is composed, for example, of a plastic material based on epoxy resin or acryl resin, but may also be composed of any other material that is suitable for the present purpose, such as a silicone resin or a mixture of the resins. For heat dissipation, it is advantageous for the thermal connecting part to be embedded such that part of it projects out of the housing base body, or forms a part of its surface, and can, thus, be thermally connected from the outside.

In accordance with again another feature of the invention, recess in the form of a radiation outlet window is, preferably, formed in the housing base body, and the thermal connecting part is embedded in the housing base body such that the chip mounting area is disposed within the radiation outlet window. By way of example, the chip mounting area may form a boundary surface of the radiation outlet window.

Such a housing shape is particularly suitable for surface-mounting components, with the side that is opposite the radiation outlet window or a side surface of the housing base body forming a contact surface for the component. The embedded thermal connecting part, preferably, extends as far as the contact surface so that the heat losses can, additionally, be dissipated through the contact surface, for example, to a heat sink or to a printed circuit board (PCB). In such a case, it is advantageous for the thermal connecting part to be configured such that a part of its surface at the same time forms the contact surface, or a surface element thereof.

In accordance with again a further feature of the invention, the radiation outlet window has side walls in the form of reflector surfaces.

In accordance with again an added feature of the invention, the chip has a main emission direction, the reflector well has reflector walls, the radiation outlet window has reflector surfaces, and the reflector walls and the reflector surfaces are at different angles with respect to the main emission direction.

In accordance with again an additional feature of the invention, an angle between the reflector walls and the main emission direction is greater than an angle between the reflector surfaces and the main emission direction.

To improve the radiation yield, the radiation outlet window in the housing base body may have a conical shape so that its side walls form a reflector. Such a reflector allows radiation components that are emitted to the side from a radiation source that is located on the chip mounting area to be deflected toward the main emission direction. The configuration results in an increase in the radiation yield, and improved focusing of the radiation.

It is advantageous for the reflector to have a shape in which the thermal connecting part forms a first part of the reflector, which is adjacent to a second reflector part, which is formed by the side walls of the radiation outlet window, and the well merges to the second part. The overall height of the reflector is, preferably, less than four times the height of a chip that is intended to be mounted on the chip mounting area. Such a configuration ensures good mechanical robustness and limits the stresses that occur as a result of temperature changes, such as those that occur during soldering processes, to a tolerable extent.

With the objects of the invention in view, there is also provided a housing for light-emitting diodes, including a leadframe including a mount part having at least one wire connecting area and at least one external electrical connecting strip, and a separately manufactured thermal connecting part linked into the mount part, the thermal connecting part having at least one chip mounting area.

With the objects of the invention in view, there is also provided a radiation-emitting component, including a radiation-emitting chip and one of a leadframe having a mount part having at least one wire connecting area and at least one external electrical connecting strip, and a separately manufactured thermal connecting part linked into the mount part, the thermal connecting part having at least one chip mounting area, and a housing for light-emitting components having a leadframe including a mount part having at least one wire connecting area and at least one external electrical connecting strip, and a separately manufactured thermal connecting part linked into the mount part, the thermal connecting part having at least one chip mounting area.

The invention, furthermore, provides for a leadframe or housing according to the invention to form a radiation-emitting component with improved heat dissipation. Such a component has a radiation-emitting chip, preferably, a semiconductor chip that is disposed on the chip mounting area of the thermal connecting part.

The chip is, preferably, at least partially sheathed by an encapsulation compound, preferably, a plastic compound, in particular, a casting resin or a molding compound. This embodiment is particularly preferable for housings with a chip that is disposed in a radiation outlet window, with the radiation outlet window being entirely or partially filled with the encapsulation compound. Reaction resins such as epoxy resin, acryl resin, silicon resins, or mixtures thereof are suitable particularly for encapsulation purposes. Furthermore, fluorescent substances can be added to the encapsulation compound, which convert the radiation that is produced by the chip to a different wavelength band. Such an embodiment is suitable particularly for a component that emits mixed colors or white light.

In accordance with still another feature of the invention, the leadframe is a surface mounted a leadframe.

To reduce the thermal stresses between the housing, the chip, and the encapsulation and, in particular, to avoid delamination of the encapsulating cover, it is advantageous to choose the encapsulated volume V such that, with regard to the height H of the chip, the following relationship:

$$V \leq q \cdot H$$

is satisfied. In such a case, q denotes a scaling factor, whose value is less than 10 mm$^2$ and is, preferably, 7 mm$^2$.

In accordance with still a further feature of the invention, the leadframe is subdivided into a first and a second electrical connecting part, with the thermal connecting part being linked into the first electrical connecting part, and the bonding wire connecting area being formed on the second electrical connecting part. A wire is connected from a contact surface of the chip to the bonding wire connecting area to provide the electrical supply.

In accordance with still an added feature of the invention, the chip is a semiconductor chip mounted on the chip mounting area of the thermal connecting part.

In accordance with still an additional feature of the invention, the chip is connected to the chip mounting area by one of an adhesive bond and a solder.

In accordance with another feature of the invention, the chip is one of adhesively bonded and soldered to the chip mounting area.

In accordance with a further feature of the invention, the chip is mounted on the chip mounting area by a silver solder, in particular, a silver solder having a melting temperature greater than 260° C.

In accordance with an added feature of the invention, there is provided a wire connection electrically conductively connecting the chip to the wire connecting area.

With the objects of the invention in view, there is also provided a method for producing a semiconductor component, including the steps of providing a leadframe having a mount part having at least one wire connecting area and at least one external electrical connecting strip, and providing a separately manufactured thermal connecting part with at least one chip mounting area, linking the thermal connecting part into the mount part, fitting a radiation-emitting chip to the chip mounting area, and embedding the mount part and the thermal connecting part in a housing molding compound.

In accordance with an additional mode of the invention, the thermal connecting part is connected to the mount part by one of riveting, crimping, and soldering.

A method for producing a component according to the invention starts with the provision of a mount part that, for example, has previously been stamped from a strip or from a sheet.

In the next step, a separately manufactured thermal connecting part is linked into an opening, which is provided for this purpose, in the mount part. The chip is, then, mounted on the thermal connecting part, for example, by adhesive bonding, by an electrically conductive adhesive, or by soldering. The leadframe that has been so formed is, finally, sheathed with a suitable housing molding compound to form the housing, for example, using an injection-molding or injection-compression method.

Mounting the chip on the leadframe before it is extrusion-coated has the advantage that high-temperature methods, for example, soldering methods, can also be used for this purpose. Injection-molded housing parts could be damaged at temperatures such as these. If this is not relevant, the method steps may, of course, also be carried out in a different sequence.

In accordance with a concomitant mode of the invention, the chip is fitted to the chip mounting area before the mount part and the thermal connecting part are embedded in the housing molding compound.

Mounting the chip on the leadframe before it is extrusion-coated allows the chip to be fitted, in particular, at temperatures above 260° C. by a silver-soldering method. This results in a particularly low thermal resistance between the chip and the leadframe. Furthermore, this results in a highly temperature-resistant connection between the chip and the thermal connecting part and, in particular, reduces the risk of detachment of the chip when the component is soldered in at typical temperatures of up to about 260° C.

Other features that are considered as characteristic for the invention are set forth in the appended claims.

Although the invention is illustrated and described herein as embodied in a leadframe and housing for a radiation-emitting component, a radiation-emitting component, and a method for producing the component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 4 is a fragmentary, perspective view of a first exemplary embodiment of a component according to the invention; and FIG. 5 is a cross-sectional view through a second exemplary embodiment of the component according to the invention.

DESCRIPTION OF THE PREFERRED EMBODIMENTS

Figure 1A:
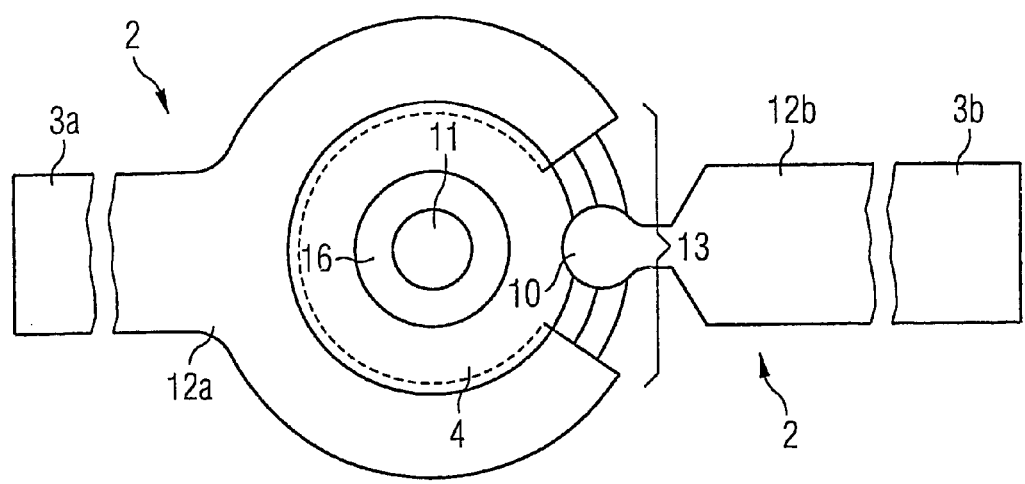
FIG. 1A is a fragmentary plan view a first exemplary embodiment of a leadframe according to the invention.
Figure 1B:
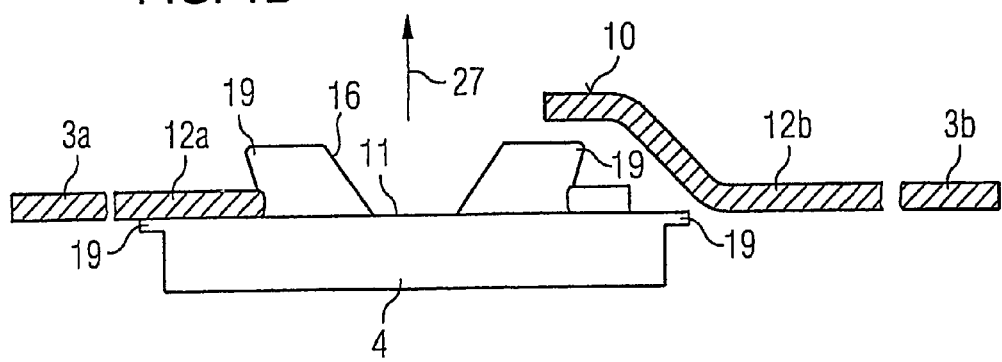
FIG. 1B is a fragmentary cross-sectional view of the leadframe of FIG. 1A.

Referring now to the figures of the drawings in detail and first, particularly to FIG. 1 thereof, there is shown a leadframe 2 having a mount part, which is subdivided into two electrical connecting parts 12a, 12b, and a thermal connecting part 4. The two electrical connecting parts 12a, 12b end in a respective solder connecting strip 3a, 3b.

One electrical connecting part 12a has an opening in the form of an eye. The thermal connecting part 4 is linked into the eye opening. For such a purpose, by way of example, the thermal connecting part 4 may be inserted with an accurate fitting into the eye opening in the electrical connecting part 12a, after which it is crimped to the electrical connecting part 12a in the form of a rivet. Alternative connections on the circumference between the thermal connecting part 4 and the electrical connecting part 12a, for example, by riveting, soldering, or welding, likewise are possible.

The thermal connecting part 4 is substantially rotationally symmetrical and has projections 19 that allow the leadframe 2 to be anchored in a robust manner in a housing. Furthermore, the thermal connecting part 4 has a central recess in the form of a reflector well 16, on whose base surface a chip-mounting area 11 is provided for holding a radiation-emitting chip. The side surfaces of the recess are used as reflector surfaces.

The eye ring of the electrical connecting part 12a has a cutout 13, at which a bonding wire connecting area 10, which is in the form of a tongue, of the second electrical connecting part 12b overlaps. The bonding wire connecting area 10 is disposed at a different height to that edge of the reflector well 16 that emits radiation. For chip mounting purposes, the configuration allows short wire connections between the chip and the bonding wire connecting area 10 without any need for a cutout for this purpose at the edge of the reflector well 16 in the thermal connecting part.

Figure 2:
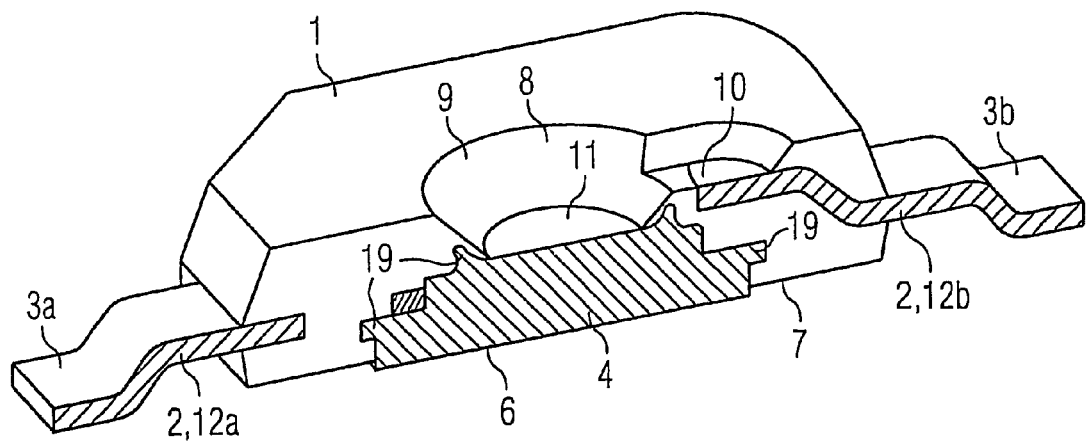
FIG. 2 is a fragmentary, partially cross-sectional and top perspective view of a first exemplary embodiment of a housing according to the invention.

FIG. 2 shows a perspective longitudinal section through one exemplary embodiment of a housing according to the invention. The housing has a base body 1 composed of a plastic molding compound that, for example, can be produced by an injection-molding or injection-compression method. The molding compound is composed, for example, of a plastic material based on epoxy resin or acryl resin, but may also be composed of any other material that is suitable for the present purpose.

A leadframe 2, which corresponds substantially to FIG. 1, and having two electrical connecting parts 12a, 12b and a thermal connecting part 4 linked in it as well as solder connecting strips 3a, 3b, is embedded in the base body 1, with the solder connecting strips 3a, 3b projecting out of the housing base body 1. Thermal connecting part 4 is formed in a largely planar manner, without a reflector well, on the side of the chip connecting area 11.

The thermal connecting part 4 is, in this case, disposed within the housing base body 1 such that the base surface 6 of the thermal connecting part 4 forms a part of the base body contact surface 7. To provide a mechanically robust anchorage in the housing base body 1, the thermal connecting part 4 is provided with projections 19 disposed on the circumference.

Opposite the contact surface 7, a recess 8 is formed as a radiation outlet window in the housing base body 1 and leads to the chip mounting area 11 on the thermal connecting part 4 so that a radiation-emitting chip that is to be mounted thereon is located within the radiation outlet window 8. The side surfaces 9 of the radiation outlet window 8 are inclined, and are used as reflectors for the radiation that is produced by a chip such as this during operation.

Figure 3:
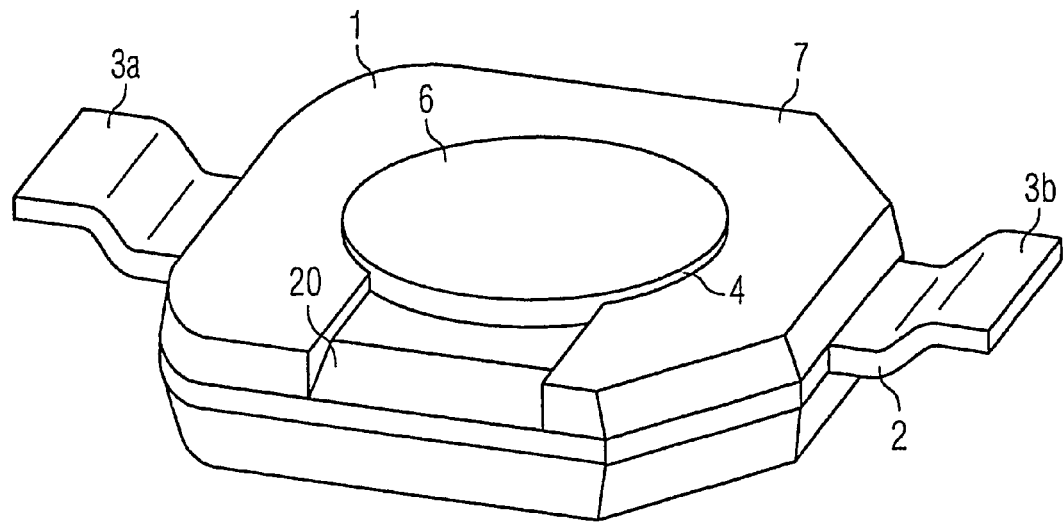
FIG. 3 is a bottom, perspective view of a second exemplary embodiment of the housing according to the invention.

FIG. 3 shows a perspective view of the contact surface 7 of a further exemplary embodiment of a housing according to the invention. As in the exemplary embodiment already described, the base surface 6 of the thermal connecting part 4 is passed out of the housing base body 1. In such a case, the base surface 6 of the thermal connecting part 4 projects somewhat out of the base body 1 so that, when the thermal connecting part 4 is installed, the configuration ensures reliable contact and a good thermal junction between the thermal connecting part 4 and a corresponding mount, such as a printed circuit board for a heat sink.

In contrast to the exemplary embodiment described above, the housing base body 1 has a groove 20 at the side, running from the thermal connecting part 4 to a side surface of the housing base body 1. If the housing is mounted on a mount, then the groove 20 allows the connection between the housing and the mount to be checked, when installed. In particular, this makes it possible to check a soldered connection between the mount and the thermal connecting part 4.

FIG. 4 shows a schematic, perspective view of one exemplary embodiment of a radiation-emitting component according to the invention.

As in the case of the exemplary embodiment that has already been described, a leadframe 2 with a thermal connecting part 4 linked to it is largely embedded in the housing base body 1 so that only the solder connecting strips 3a, 3b project out of the housing base body 1 at the side. The thermal connecting part 4 forms (in a manner that is not illustrated) a part of the contact surface 7 of the housing base body, and can, thus, be thermally connected from the outside.

A radiation-emitting chip 5 such as a light-emitting diode is mounted on the chip mounting area 11 of the thermal connecting part 4, and is, preferably, a semiconductor chip, for example, an LED chip or a laser chip, which is soldered to the thermal connecting part 4 by a silver solder. Alternatively, the chip 5 may be adhesively bonded to the chip mounting area 11 using an adhesive that has sufficient thermal conductivity and is, preferably, also electrically conductive.

Semiconductor materials based on gallium arsenide, gallium phosphide, and gallium nitride, such as GaAlAs, InGaAs, InGaAlAs, InGaAlP, GaN, GaAlN, InGaN, and InGaAlN are suitable particularly as efficient radiation sources.

The component housing substantially corresponds to the housing illustrated in FIGS. 2 and 3. In contrast thereto, the thermal connecting part 4 has a reflector well 16 that surrounds the chip 5. The reflector surfaces of this reflector well 16 merge substantially smoothly into the side surfaces 9 of the radiation outlet window 8, resulting in an overall reflector that is composed of an area element formed by the thermal connecting part 4 and an area element formed by the side surfaces 9 of the radiation outlet window 8.

The radiation outlet window 8 is also extended somewhat in the longitudinal direction of the component and has a bonding wire connecting area 10 on that electrical connecting part 12b of the leadframe 2 that is not connected to the thermal connecting part 4. A wire connection 17 is passed from the bonding wire connecting area 10 to a contact surface on the chip 5.

The bonding wire connecting area 10 is disposed at a different height to that edge of the reflector well 16 of the thermal connecting part 4 that is on the side that emits radiation. Such a configuration allows a short, and, thus, mechanically robust, wire connection between the chip 5 and the bonding wire connecting area 10 because the latter can be moved close to the chip 5. Furthermore, the height of the wire clip that is produced in this way is kept small, thus reducing the risk of a short-circuit that could occur, for example, if the chip were covered with encapsulation by folding the wire connection 17 over onto the thermal connecting part 4 at the side.

FIG. 5 shows a cross-section through a further exemplary embodiment of the component according to the invention. The section profile corresponds to the line A-A shown in FIG. 4.

As in the case of the exemplary embodiment illustrated in FIG. 3, the thermal connecting part is recessed centrally on the mounting face for the chip 5 to result in a reflector well 16 for the radiation that is produced by the chip 5, to which the reflector side walls 9 of the radiation outlet window 8 are connected.

In contrast to the previous exemplary embodiment, the overall reflector 15 formed in this way has a kink at the junction point between the reflector elements 9, 16. The kink shape results in the overall reflector 15 being a better approximation to a paraboloid of rotation, thus resulting in an advantageous radiation emission characteristic. The light that is emitted from the chip 5 at a steep angle with respect to the base surface of the well is deflected to a greater extent towards the main radiation emission direction 27 of the component.

To protect the chip 5, the radiation outlet window 8 is filled with encapsulation 14, for example, a reaction resin such as epoxy resin or acryl resin. To focus the radiation that is produced, the encapsulation 14 may be shaped as a lens, with a slightly curved surface 18.

To achieve a mechanically robust connection between the encapsulation 14, the housing base body 1, and the leadframe 2, it is advantageous to choose the height A of the reflector well 16 in the thermal connecting part to be less than twice the height H of the chip 5. The height B of the overall reflector 15 that is formed by the thermal connecting part 4 and the housing base body 1 should be less than four times the height H of the chip 5. Finally, it is advantageous to shape the radiation outlet window 8 such that the above-mentioned relationship:

$$V \leq q \cdot H$$

is satisfied for the volume V of encapsulation, where q is less than 10 mm$^2$ and is, preferably, approximately 7 mm$^2$. Compliance with these measures advantageously improves the mechanical robustness and, hence, the load capacity and life of the component. This aim is, likewise, contributed to by using the projections 19 in the housing base body 1 to anchor the thermal connecting part 4.

To produce such a component, a mount part (which, for example, is stamped from a mount strip) is, first of all, provided with an opening for the leadframe 2. The thermal connecting part 4 is, then, inserted into the opening in the mount part, and is crimped to the mount part.

In the next step, the radiation-emitting chip 5 is fitted to the thermal connecting part 4, for example, by being soldered or adhesively bonded onto the thermal connecting part 4. To form the housing base body 1, the leadframe 2 that is formed from the mount part and the thermal connecting part 4 is sheathed, together with the already installed chip 5, by a molding compound, except for that area that surrounds the chip 5, as well as the bonding wire connecting area 10. This may be done, for example, using an injection-molding or injection-compression method. Finally, a wire connection 17 is passed from the bonding wire connecting area 10 to a contact surface on the chip 5.

Alternatively, after the connection of the mount part and the thermal connecting part 4, the leadframe 2 so formed is, first of all, sheathed in the molding compound, and the chip 5 is, then, mounted on the chip connecting area 11, preferably, by being adhesively bonded to it, and contact is made with it.

The explanation of the invention based upon the described exemplary embodiments does not, of course, represent any restriction of the invention to the exemplary embodiment. Furthermore, leadframes and housings according to the invention can also be used for other components that require efficient heat dissipation, and other types of semiconductor body may be used as the chip.

The method described above, including the steps providing a leadframe and fitting of the chip, preferably, by soldering it on, before sheathing of the leadframe with a molding compound, with the area around the chip being left free, can also be transferred to other housing forms without a thermal connecting part, and represents an invention in its own right.

The advantages of the method are, in particular, that mounting of the chip can largely be optimized independently of the characteristics of the molding compound. By way of example, a soldering process can be carried out in an extended temperature range. In such a case, it is possible to use solders, preferably, with a melting temperature above 260° C. such as silver solders, which form a connection with a very low thermal resistance between the chip and the leadframe. Furthermore, this makes it possible to reduce the risk of the chip becoming detached and the corresponding component being soldered onto a printed circuit board.

We claim:
1. A radiation-emitting component, comprising:
a radiation-emitting semiconductor chip at least partially sheathed with a radiation-permeable compound; and
one of:
  a leadframe; and
  a housing for light-emitting components having a leadframe,
    wherein the leadframe comprises:
      a mount part having:
        at least one wire connecting area an opening formed therein and extending completely through the mount part; and
at least one external electrical connecting strip; and
a separately manufactured thermal connecting part disposed in said opening and fastened into said mount part to form an electrical connection with the at least one external electrical connecting strip, said thermal connecting part having at least one chip mounting area and a reflector well surrounding said chip mounting area,
wherein the thermal connecting part extends through the opening in the mount part and connects to the mount part at the opening to transfer heat away from the mount part,
wherein said radiation-permeable compound is a plastic compound; and
wherein said radiation-permeable compound has a volume described by the formula $V \leqq qH$, where H is a height of said chip and q is a scaling factor having a value that is less than 10 mm$^2$.

2. The radiation-emitting component according to claim 1, wherein said plastic compound is one of a casting resin and a molding compound.

3. The radiation-emitting component according to claim 1, wherein said plastic compound contains at least one of a group consisting of an epoxy resin, an acryl resin, a silicone resin, and a mixture of at least two of said epoxy resin, said acryl resin, and said silicone resin.

4. The radiation-emitting component according to claim 1, wherein q is a scaling factor having a value approximately equal to 7 mm$^2$.

5. The radiation-emitting component according to claim 1, wherein said semiconductor chip is mounted on said chip mounting area of said thermal connecting part.

6. The radiation-emitting component according to claim 5, wherein said chip is connected to said chip mounting area by one of an adhesive bond and a solder.

7. The radiation-emitting component according to claim 5, wherein said chip is one of adhesively bonded and soldered to said chip mounting area.

8. The radiation-emitting component according to claim 6, wherein said chip is mounted on said chip mounting area by a silver solder.

9. The radiation-emitting component according to claim 8, wherein said silver solder has a melting temperature greater than 260° C.

10. The radiation-emitting component according to claim 1, further comprising a wire connection electrically conductively connecting said chip to said wire connecting area.

11. The radiation-emitting component according to claim 1, wherein the leadframe is a surface-mountable component.

12. The radiation-emitting component according to claim 1, wherein said mount part has one of a bracket and an eye into which said thermal connecting part is fastened.

13. The radiation-emitting component according to claim 1, wherein said thermal connecting part and said mount part are connected by at least one of the group consisting of a crimped connection, a riveted connection, a soldered connection, and a welded connection therebetween.

14. The radiation-emitting component according to claim 1, further comprising a connection between said thermal connecting part and said mount part, said connection being at least one of a crimped connection, a riveted connection, a soldered connection, and a welded connection.

15. The radiation-emitting component according to claim 1, wherein said wire connecting area is disposed at a higher level than said chip mounting area as viewed from said chip mounting area.

16. The radiation-emitting component according to claim 15, wherein:
said reflector well has an edge; and
said wire connecting area is disposed above said edge as viewed from said chip mounting area.

17. The radiation-emitting component according to claim 1, wherein:
a chip is to be mounted on said chip mounting area; and
said reflector well has height no greater than twice a height of the chip.

18. The radiation-emitting component according to claim 1, said thermal connecting part having at least one chip mounting area, and comprising at least one of copper, aluminum, molybdenum, iron, nickel, and tungsten.

19. The radiation-emitting component according to claim 1, wherein said chip mounting area has a surface coating for improving mounting of a chip.

20. The radiation-emitting component according to claim 19, wherein said surface coating is at least one of a silver coating and a gold coating.

21. The radiation-emitting component according to claim 1, wherein said leadframe comprises at least one of copper and iron.

22. The radiation-emitting component according to claim 1, wherein the radiation-emitting component is a light-emitting diode component.

23. A radiation-emitting component, comprising:
a radiation-emitting chip at least partially sheathed with a radiation-permeable compound, and one of:
a leadframe; and
a housing for light-emitting components having a leadframe,
wherein the leadframe comprises:
a mount part having at least one wire connecting area, an opening formed therein and extending completely through the mount part, and at least one external electrical connecting strip; and
a separately manufactured thermal connecting part disposed in said opening and fastened into said mount part to form an electrical connection with the at least one external electrical connecting strip, said thermal connecting part having at least one chip mounting area,
wherein the thermal connecting part extends through the opening in the mount part and connects to the mount part at the opening to transfer heat away from the mount part,
wherein the chip is a semiconductor chip, the radiation-permeable compound is a plastic compound, and the radiation-permeable compound has a volume described by the formula $V \leqq qH$, where H is a height of said chip and q is a scaling factor having a value that is less than 10 mm$^2$.

24. The radiation-emitting component according to claim 23, further comprising a housing base body formed from a molding compound, wherein said leadframe is embedded in said base body to pass out said connecting strip from said base body, said thermal connecting part has a thermal connecting surface thermally connectable from the outside, and the housing is a surface mounted housing having a bearing surface for the surface mounting with the thermal connecting surface extending to the bearing surface for conducting heat to an exterior surface to which the bearing surface mounts the housing.

25. The radiation-emitting component according to claim 24, wherein the chip mounting area and the thermal connecting surface are on opposite sides of the thermal connecting part.

26. The radiation-emitting component according to claim 25, wherein:
    said base body has a radiation outlet window; and
    said thermal connecting part is embedded in said base body to dispose said chip mounting area in said radiation outlet window.

27. The radiation-emitting component according to claim 26, wherein said radiation outlet window has side walls in the form of reflector surfaces.

28. The radiation-emitting component according to claim 26, wherein said radiation outlet window has reflective side walls.

29. The radiation-emitting component according to claim 27, wherein:
    said thermal connecting part has a reflector well forming a first part of a reflector;
    said side walls of said radiation outlet window form a second part of said reflector; and
    said well merges to said second part.

30. The radiation-emitting component according to claim 29, wherein:
    a chip is to be mounted on said chip mounting area; and
    an overall height of said reflector is no greater than four times a height of the chip.

31. The radiation-emitting component according to claim 30, wherein:
    the chip has a main emission direction;
    said reflector well has reflector walls;
    said radiation outlet window has reflector surfaces; and
    said reflector walls and said reflector surfaces are at different angles with respect to the main emission direction.

32. The radiation-emitting component according to claim 31, wherein an angle between said reflector walls and the main emission direction is greater than an angle between said reflector surfaces and the main emission direction.

33. The radiation-emitting component according to claim 23, wherein said leadframe is a surface mounted leadframe.

* * * * *

UNITED STATES PATENT AND TRADEMARK OFFICE
CERTIFICATE OF CORRECTION

| | | |
|---|---|---|
| PATENT NO. | : 8,097,937 B2 | Page 1 of 1 |
| APPLICATION NO. | : 10/683712 | |
| DATED | : January 17, 2012 | |
| INVENTOR(S) | : Georg Bogner et al. | |

It is certified that error appears in the above-identified patent and that said Letters Patent is hereby corrected as shown below:

Column 10
Line 67, delete "area" and insert --area;--

Signed and Sealed this
Seventeenth Day of April, 2012

David J. Kappos
*Director of the United States Patent and Trademark Office*

UNITED STATES PATENT AND TRADEMARK OFFICE
Certificate

Patent No. 8,097,937 B2                      Patented: January 17, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Georg Bogner, Lappersdorf (DE); Herbert Brunner, Regensburg (DE); Michael Hiegler, Regensburg (DE); Günter Waitl, Regensburg (DE); and Rolf Haenggi, Feldbrunnen (CH).

Signed and Sealed this Tenth Day of September 2013.

KEN PARKER
*Supervisory Patent Examiner*
Art Unit 2815
Technology Center 2800